(12) United States Patent
Tatebayashi

(10) Patent No.: US 7,656,155 B2
(45) Date of Patent: Feb. 2, 2010

(54) MAGNETIC RESONANCE IMAGING APPARATUS AND IMAGING METHOD IN THE SAME

(75) Inventor: Isao Tatebayashi, Utsunomiya (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 632 days.

(21) Appl. No.: 11/589,742

(22) Filed: Oct. 31, 2006

(65) Prior Publication Data

US 2007/0167730 A1 Jul. 19, 2007

(30) Foreign Application Priority Data

Oct. 31, 2005 (JP) ............................. 2005-317284

(51) Int. Cl.
*G01V 3/00* (2006.01)
(52) U.S. Cl. ........................................ 324/307; 324/309
(58) Field of Classification Search ......... 324/300–322; 600/407–435
See application file for complete search history.

(56) References Cited

U.S. PATENT DOCUMENTS

| 6,437,571 | B1 * | 8/2002 | Danby et al. ................. 324/322 |
| 6,915,152 | B2 * | 7/2005 | Zhu ............................. 600/422 |
| 7,312,610 | B2 * | 12/2007 | Harder ......................... 324/307 |
| 7,388,376 | B2 * | 6/2008 | Heid et al. ................... 324/307 |
| 7,528,601 | B2 * | 5/2009 | Fautz et al. .................. 324/307 |
| 2005/0264286 | A1 | 12/2005 | Harder |
| 2007/0210793 | A1 * | 9/2007 | Kiefer ......................... 324/307 |
| 2008/0015430 | A1 * | 1/2008 | Takamori ..................... 600/415 |

FOREIGN PATENT DOCUMENTS

| JP | 1-166750 | 6/1989 |
| JP | 6-66629 | 9/1994 |
| JP | 2000-308627 | 11/2000 |
| JP | 2003-250775 | 9/2003 |
| JP | 2004-97826 | 4/2004 |
| JP | 2005-342515 | 12/2005 |

\* cited by examiner

*Primary Examiner*—Brij B Shrivastav
(74) *Attorney, Agent, or Firm*—Nixon & Vanderhye PC

(57) ABSTRACT

A magnetic resonance imaging apparatus is provided. The apparatus includes an imaging unit applying a gradient magnetic field and a radio frequency pulse to an inspection body in an magnetostatic field and generating a magnetic resonance signal, a bed having a top panel for placing the inspection body thereon and sliding the top panel in a longitudinal direction, a radio frequency coil for detecting the magnetic resonance signal, a display unit displaying a positioning image, a determining unit determining an ROI (a region of interest) on the basis of designation on the positioning image, a comparing unit comparing the ROI with an available FOV (a field of view) defined by the magnetostatic field, a calculating unit calculating a plurality of FOVs including the ROI when the comparing unit determines that the size of the ROI is greater than that of the available FOV, and a control unit controlling the imaging unit, the bed, and the radio frequency coil so as to perform an imaging operation on each of the FOVs.

16 Claims, 9 Drawing Sheets

MAGNETIC RESONANCE IMAGING APPARATUS AND IMAGING METHOD IN THE SAME

CROSS-REFERENCE TO RELATED APPLICATIONS

This application is based upon and claims the benefit of priority from prior Japanese Patent Application No. 2005-317284, filed Oct. 31, 2005, the entire contents of which are incorporated herein by reference.

BACKGROUND OF THE INVENTION

1. Field of the Invention The present invention relates to a magnetic resonance imaging apparatus in which an image related to a range of interest designated by an operator is obtained.

2. Description of the Related Art
In a known magnetic resonance imaging (MRI) apparatus, positioning of a field of view (FOV) is performed by determining a range of interest (ROI) which is designated on a reference image for positioning. Since the FOV available in a single imaging operation is limited in the MRI apparatus, it is only possible to designate the ROI in a range that does not exceed the available FOV.

Recently, a method in which a plurality of images obtained through a plurality times of imaging operations are connected to each other so as to obtain a wider range of image has been contemplated. In this case, the operator has to determine the FOV by designating the ROI at every imaging operation.

Examples of an FOV setting method are disclosed in JP-A-1-166750, JP-A-2003-250775, JP-A-2004-97826, JP-A-2000-308627, JP-UM-A-6-66629, and JP-T-2004-527301, for example.

However, in the known MRI apparatus described above, when the operator desires to image a sectional region exceeding the FOV available in a single imaging operation, the operator has to suitably designate the ROIs in correspondence with the desired sectional region. As the number of the imaging operation increases, the accompanying workload increases accordingly, thereby complicating the work.

BRIEF SUMMARY OF THE INVENTION

It is therefore desirable to reduce burdens imposed on the operator when the operator desires to obtain an image related to a region exceeding the available FOV.

According to an aspect of the invention, there is provided a magnetic resonance imaging apparatus which includes an imaging unit applying a gradient magnetic field and a radio frequency pulse to an inspection body in an magnetostatic field and generating a magnetic resonance signal; a bed having a top panel for placing the inspection body thereon and sliding the top panel in a longitudinal direction; a radio frequency coil for detecting the magnetic resonance signal; a display unit displaying a positioning image; a determining unit determining an ROI (a region of interest) on the basis of designation on the positioning image; a comparing unit comparing the ROI with an available FOV (a field of view) defined by the magnetostatic field; a calculating unit calculating a plurality of FOVs including the ROI when the comparing unit determines that the size of the ROI is greater than that of the available FOV; and a control unit controlling the imaging unit, the bed, and the radio frequency coil so as to perform an imaging operation on each of the FOVs.

According to another aspect of the invention, there is provided a magnetic resonance imaging apparatus which includes an imaging unit applying a gradient magnetic field and a radio frequency pulse to an inspection body in an magnetostatic field and generating a magnetic resonance signal; a bed having a top panel for placing the inspection body thereon and sliding the top panel in a longitudinal direction; a radio frequency coil for detecting the magnetic resonance signal; a display unit displaying a positioning image; a determining unit determining a plurality of ROIs (a region of interest), the size of each of which is smaller than that of an available FOV (a field of view) defined by the magnetostatic field, on the basis of designation on the positioning image; a moving unit moving at least one of the ROIs on the basis of the designation on the positioning image and moving an ROI other than the moved ROI to be in a predetermined state with respect to the moved ROI; a fixing unit fixing the plurality of ROIs; and a control unit controlling the imaging unit, the bed, and the radio frequency coil so as to perform an imaging operation on each of the ROIs fixed by the fixing unit.

According to a further aspect of the invention, there is provided an imaging method in a magnetic resonance imaging apparatus having an imaging unit applying a gradient magnetic field and a radio frequency pulse to an inspection body in an magnetostatic field and generating a magnetic resonance signal, a bed having a top panel for placing the inspection body thereon and sliding the top panel in a longitudinal direction, a radio frequency coil for detecting the magnetic resonance signal, and a display unit displaying a positioning image, the method including: determining an ROI (a region of interest) on the basis of designation of the positioning image; comparing the ROI with an available FOV (a field of view) defined by the magnetostatic field; calculating a plurality of FOVs including the ROI when it is determined by the comparing unit that the size of the ROI is greater than that of the available FOV; and controlling the imaging unit, the bed, and the radio frequency coil so as to perform an imaging operation on each of the FOVs.

According to a still further aspect of the invention, there is provided an imaging method in a magnetic resonance imaging apparatus having an imaging unit applying a gradient magnetic field and a radio frequency pulse to an inspection body in an magnetostatic field and generating a magnetic resonance signal, a bed having a top panel for placing the inspection body thereon and sliding the top panel in a longitudinal direction, a radio frequency coil for detecting the magnetic resonance signal, and a display unit displaying a positioning image, the method including: determining a plurality of ROIs (a region of interest), the size of each of which is smaller than that of an available FOV (a field of view) defined by the magnetostatic field, on the basis of designation on the positioning image; moving at least one of the ROIs on the basis of the designation on the positioning image and moving an ROI other than the moved ROI to be in a predetermined state with respect to the moved ROI; fixing the plurality of ROIs; and controlling the imaging unit, the bed, and the radio frequency coil so as to perform an imaging operation on each of the fixed ROIs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, the embodiments of the invention will be described with reference to drawings.

Figure 1:
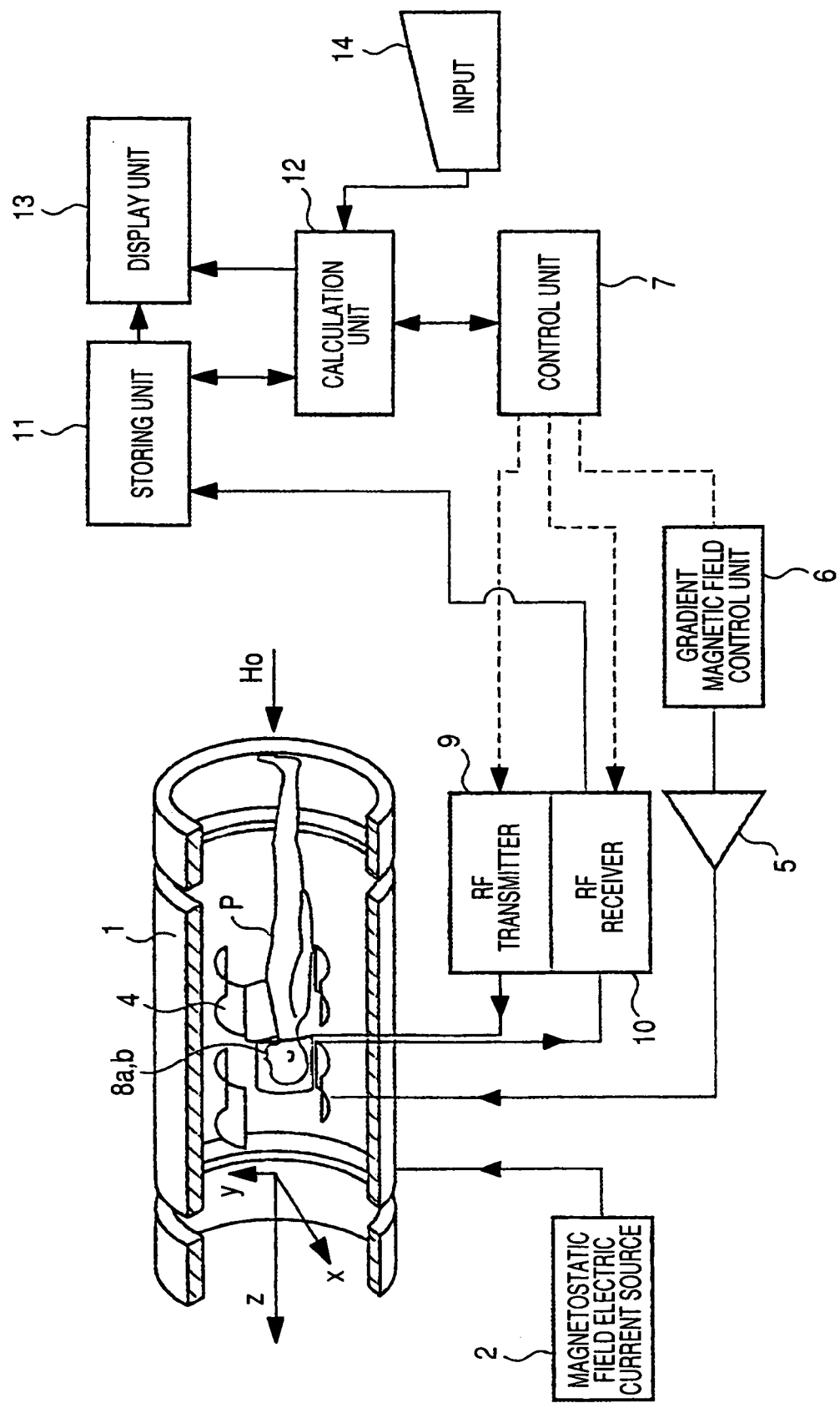
FIG. 1 is a block diagram showing a magnetic resonance imaging (MRI) apparatus in accordance with embodiments of the invention.

FIG. 1 is a block diagram showing a magnetic resonance imaging (MRI) apparatus in accordance with embodiments of the invention. The MRI apparatus functionally includes a magnet unit for generating a magnetostatic field, a gradient magnetic field generating unit for generating a gradient magnetic field for providing positional information to the magnetostatic field, a transceiver unit for magnetic excitation and a nuclear magnetic resonance (NMR) signal reception, and a control and calculating unit for system control and data processing.

Specifically, as illustrated in FIG. 1, the magnet unit includes a normal conduction type magnet 1, for example, and a magnetostatic field electric current source 2 supplying a current to the magnet 1. The magnet unit generates a magnetostatic field H0 in a z-axis direction of an opening unit through which an inspection body P is inserted.

The gradient magnetic field generating unit includes a gradient magnetic field electric current source which is constituted by a triplet of gradient magnetic field coils 4 mounted on the magnet 1 in x-, y-, z-directions, a driving circuit 5 supplying a current to the gradient magnetic field coils 4, and a gradient magnetic field control unit 6. The gradient magnetic field control unit 6 activates the drive circuit 5 in accordance with a pulse sequence supplied from a main control unit 7. Then, a linear magnetic field is superimposed on the magnetostatic field H0 in order to provide positional information for imaging, thereby forming the gradient magnetic field.

The transceiver unit includes a transmitting coil 8a and a receiving coil 8b disposed in the opening unit of the magnet 1 so as to face the inspection body P, and a transmitter 9 and a receiver 10 connected respectively to the transmitting coil 8a and the receiving coil 8b. The transmitter 9 generates a radio frequency pulse for NMR excitation on the basis of instructions from the control unit 7. The receiver 10 detects and amplifies the NMR signal obtained by the receiving coil 8b and sends the NMR signal to a memory unit 11 on the basis of the instructions from the control unit 7.

The control and calculating unit includes the control unit 7, the memory unit 11, a calculating unit 12, a display unit 13, and an input unit 14. The memory unit 11 memorizes the NMR signal. The calculating unit 12 provides an operational instruction to the control unit 7. Moreover, the calculating unit 12 subjects the NMR signal memorized in the memory unit 11 to a calculation processing including a Fourier transformation, for example, so as to generate image data. The display unit 13 displays an image represented by the image data generated by the calculating unit 12 or displays various kinds of information that is to be notified to the operator under the control of the calculating unit 12. The input unit 14 includes a keyboard or a mouse, for example, and the operator inputs various designation using the input unit 14.

The MRI apparatus according to the embodiments of the invention has the above-mentioned basic construction.

First Embodiment

In a first embodiment, the calculating unit 12 further includes several functions described later. A first function is a function of determining a range of interest (ROI) designated by manipulations in the input unit 14. The first function allows designation of the ROI regardless of a field of view (FOV) available in a single imaging operation. A second function is a function of determining a point of interest by designating the point of interest in the ROI by manipulations in the input unit 14. A third function is a function of setting a plurality of FOVs so as to include the whole ROI when the size of the designated ROI is greater than that of the available FOV. In the third function, when the point of interest is designated, the plurality of FOVs is set so that the point of interest is positioned in the middle of a single FOV. A fourth function is a function of instructing the control unit 7 to perform an imaging operation on each of the FOVs, and connecting a plurality of images obtained through a plurality times of imaging operations, thereby generating image data related to the ROI.

Hereinafter, operations of the MRI apparatus according to the first embodiment having the above-mentioned construction will be described.

Figure 2:
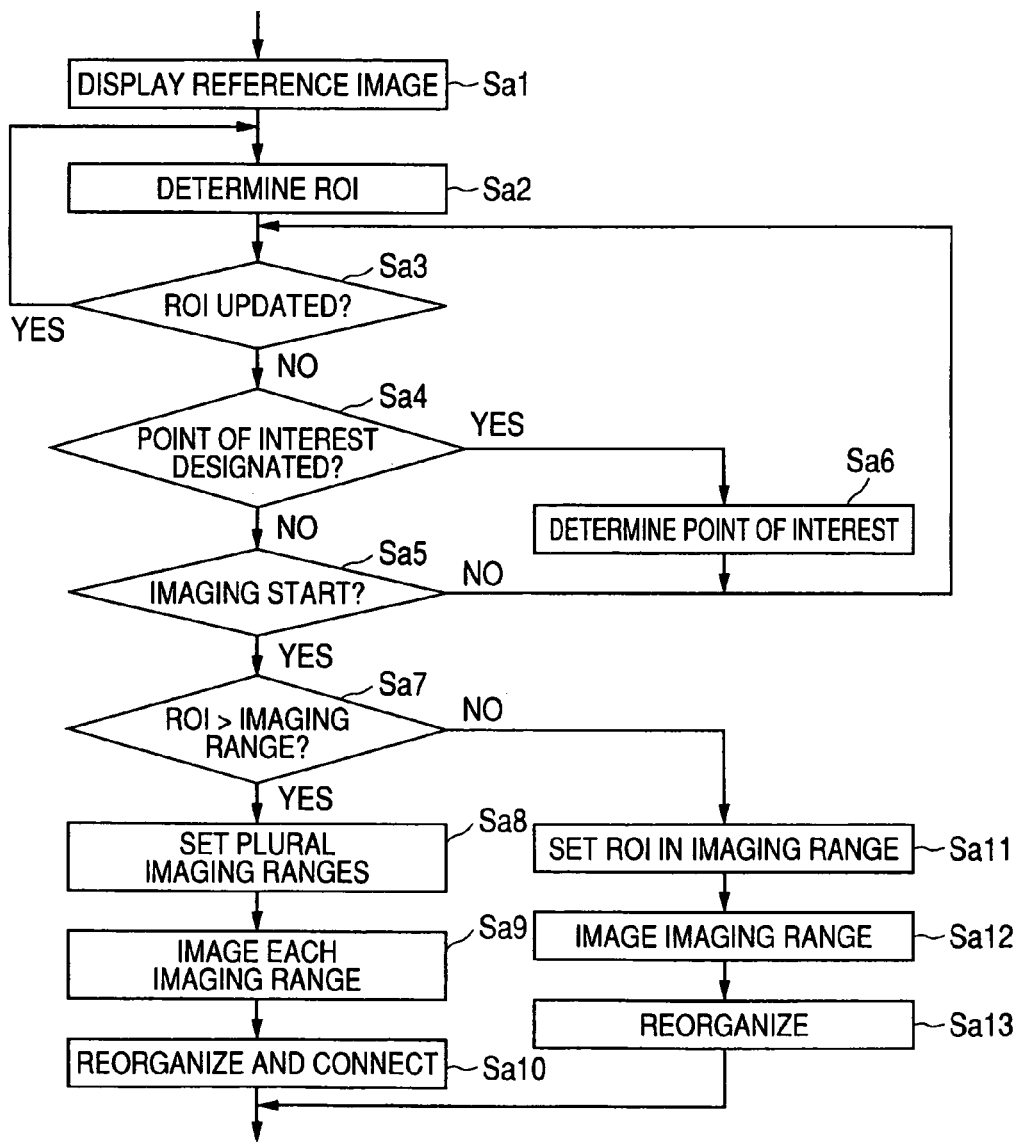
FIG. 2 is a flowchart showing operations performed by a calculation unit shown in FIG. 1 in accordance with a first embodiment of the invention.

FIG. 2 is a flowchart showing operations performed by a calculation unit 12 in accordance with a first embodiment.

Figure 3:
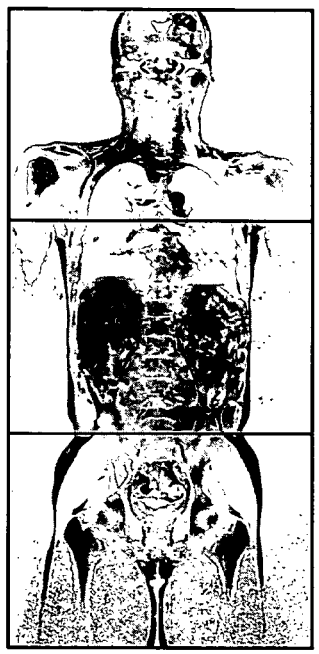
FIG. 3 is a diagram showing an example of a reference image.

In step Sa1, the calculating unit 12 displays a reference image prepared in advance as illustrated in FIG. 3, for example, on the display unit 13. The reference image is reorganized on the basis of the NMR signal collected in a high speed from a wide range while changing the position of a bed, for example.

The operator designates a region requiring a high-definition imaging operation as the ROI by observing the reference image and manipulating the input unit 14. In step Sa2, the calculating unit 12 determines the designated ROI on the basis of output information from the input unit 14. In this case, the calculating unit 12 does not put restrictions on the size of the ROI. The calculating unit 12 superimposes the determined ROI on the reference image as illustrated by numeral 21 in FIG. 4, for example.

In steps Sa3 to Sa5, the calculating unit 12 waits for the occurrence of any one of events: a change of the ROI, a designation of the point of interest, and a start of the imaging.

The operator changes the once-designated ROI by manipulating the input unit 14 in accordance with necessity. When an operation of changing the ROI is performed, the calculating unit 12 returns to step Sa2 from step Sa3 and determines the changed ROI.

The operator may designate the point of interest in the ROI by manipulating the input unit 14. When an operation of designating the point of interest is performed, the calculating unit 12 proceeds from step Sa4 to step Sa6. In step Sa6, the calculating unit 12 determines the designated point of interest. Thereafter, the calculating unit 12 returns to a waiting state from steps Sa3 to Sa5.

Figure 4:
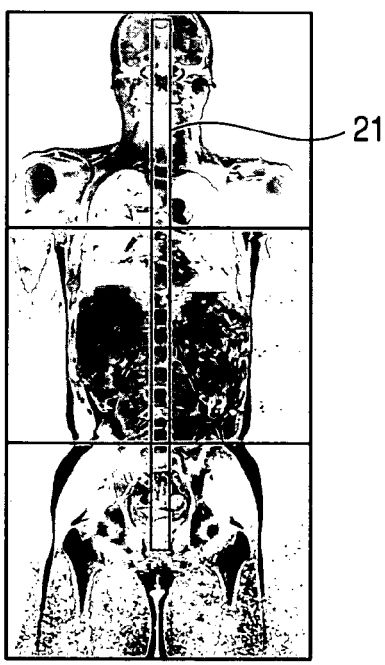
FIG. 4 is a diagram showing an example of displaying a range of interest (ROI) in accordance with the first embodiment.
Figure 5:
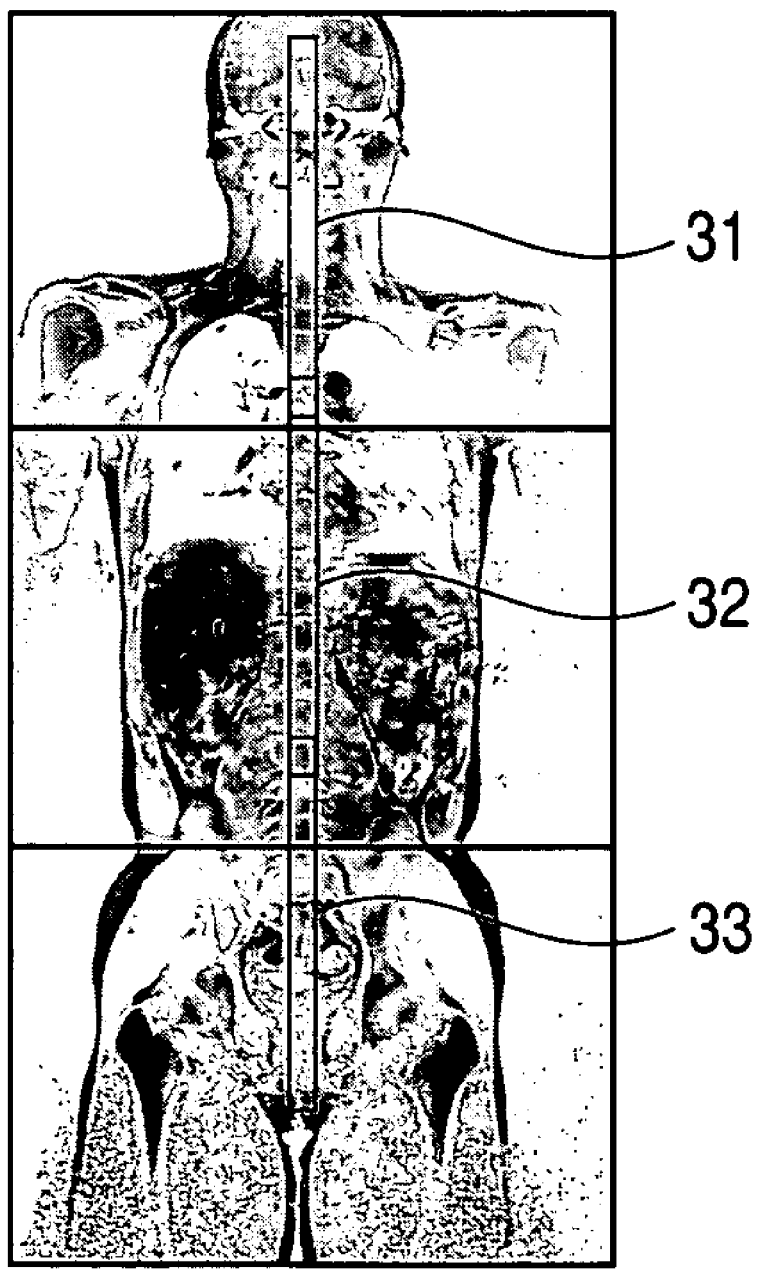
FIG. 5 is a diagram showing an example of setting a field of view (FOV) in accordance with the first embodiment.

After finishing the designation of the ROI, the operator instructs to start an imaging operation by manipulating the input unit 14. In response to the imaging start instruction, the calculating unit 12 proceeds from step Sa5 to step Sa7. In step Sa7, the calculating unit 12 determines whether the size of the ROI determined at that moment is greater than that of the available FOV. When the size of the ROI is greater than that of the available FOV, the calculating unit 12 proceeds from step Sa7 to step Sa8. In step Sa8, the calculating unit 12 sets a plurality of FOVs so as to include the whole ROI. If the calculating unit 12 has determined the designated point of interest in step Sa6, the calculating unit 12 sets the FOVs so that the point of interest is positioned in the middle of a single FOV. It is desirable to partly superimpose adjacent FOVs on each other. FIG. 5 is a diagram showing an example of setting the FOV related to the designated ROI as illustrated in FIG. 4. Three FOVs 31, 32, and 33 are set in FIG. 5. Moreover, the FOV 31 and the FOV 32 or the FOV 32 and the FOV 33 are partly superimposed on each other, respectively.

In step Sa9, the calculating unit 12 sends instructions to the control unit 7 to perform an imaging operation on each of the FOVs set in step Sa8. In step Sa10, the calculating unit 12 reorganizes images in each of the FOVs on the basis of the collected NMR signal and connects the reorganized images to each other, thereby generating a reorganized image corresponding to the ROI.

On the other hand, when the size of the ROI is smaller than that of the available FOV, the calculating unit 12 proceeds from step Sa7 to step Sa11. In step Sa11, the calculating unit 12 sets the ROI as it is as the FOV.

In step Sa12, the calculating unit 12 sends instructions to the control unit 7 to perform an imaging operation on the FOV set in step Sa11. In step Sa13, the calculating unit 12 reorganizes images in the FOV on the basis of the collected NMR signal.

According to the first embodiment, even when the operator desires to obtain a reorganized image related to a region exceeding the available FOV, the operator needs only to designate a single ROI. Accordingly, it is possible to reduce burdens imposed on the operator compared to the case of designating a plurality of ROIs.

In addition, according to the first embodiment, it is possible to remarkably increase throughputs of a positioning scanning. That is, since a plurality of FOVs is set by dividing a single ROI into a plurality of ROIs, it is possible to suitably maintain relative positions of the plurality of FOVs when connecting the reorganized images related to each of the FOVs to each other, thereby increasing connection precision.

Second Embodiment

In a second embodiment, the calculating unit 12 further includes several functions described later. A first function is a function of determining a plurality of ROIs designated to be parallel to each other by manipulations in the input unit 14. The first function restricts designation of the ROIs so that one of the ROIs does not exceed the available FOV. A second function is a function of moving one of the ROIs in accordance with designation of movement by manipulations in the input unit 14. Moreover, the second function moves an ROI other than the moved ROI in a direction parallel to the moving direction of the moved ROI in the same state as being determined by the first function. A third function is a function of instructing the control unit 7 to perform an imaging operation on each of the plurality of FOVs, and connecting a plurality of images obtained through a plurality times of imaging operations, thereby generating image data related to the ROI.

Hereinafter, operations of the MRI apparatus according to the second embodiment having the above-mentioned construction will be described.

Figure 6:
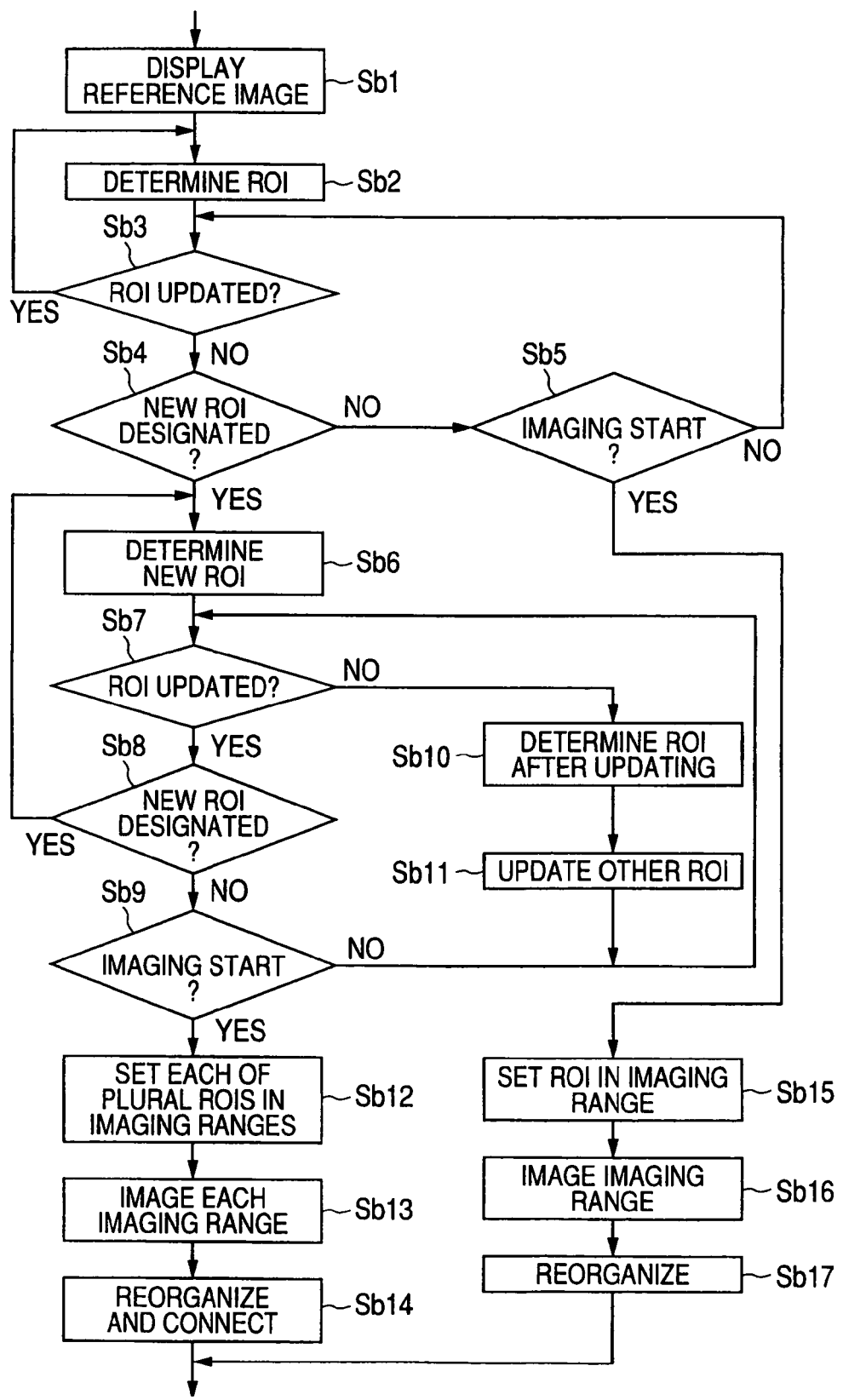
FIG. 6 is a flowchart showing operations performed by a calculation unit shown in FIG. 1 in accordance with a second embodiment of the invention.

FIG. 6 is a flowchart showing operations performed by a calculation unit 12 in accordance with the second embodiment.

In step Sb1, the calculating unit 12 displays a reference image prepared in advance as illustrated in FIG. 3, for example, on the display unit 13.

The operator designates a region requiring a high-definition imaging operation as the ROI by observing the reference image and manipulating the input unit 14. In step Sb2, the calculating unit 12 determines the designated ROI on the basis of output information from the input unit 14. In this case, the calculating unit 12 restricts the size of the ROI so as not to exceed the available FOV.

Subsequently, the calculating unit 12 proceeds to a waiting state from steps Sb3 to Sb5. In the waiting state, the calculating unit 12 waits for the occurrence of any one of events: a change of the ROI, a designation of a new ROI, and a start of the imaging.

The operator changes the once-designated ROI by manipulating the input unit 14 in accordance with necessity. When an operation of changing the ROI is performed, the calculating unit 12 returns to step Sb2 from step Sb3 and determines the changed ROI.

The operator designates a new ROI by manipulating the input unit 14 in accordance with necessity. When an operation of designating the new ROI is performed, the calculating unit 12 proceeds from step Sb4 to step Sb6. In step Sb6, the calculating unit 12 determines the newly designated ROI on the basis of output information from the input unit 14.

Thereafter, the calculating unit 12 returns to a waiting state from steps Sb7 to Sb9. In the waiting state, the calculating unit 12 waits for the occurrence of any one of events: a change of the ROI, a designation of a new ROI, and a start of the imaging.

The operator may designate another new ROI by manipulating the input unit 14 in accordance with necessity. When an operation of designating the new ROI is performed, the calculating unit 12 returns to step Sb6 from step Sb8 and determines the newly designated ROI. The number of ROIs that can be designated in the invention may be restricted so as not to exceed a threshold number of ROIs.

The operator changes one of the designated ROIs by manipulating the input unit 14 in accordance with necessity. When an operation of changing the ROI is performed, the calculating unit 12 proceeds from step Sb7 to step Sb10. In step Sb10, the calculating unit 12 determines a changed ROI.

Figure 7:
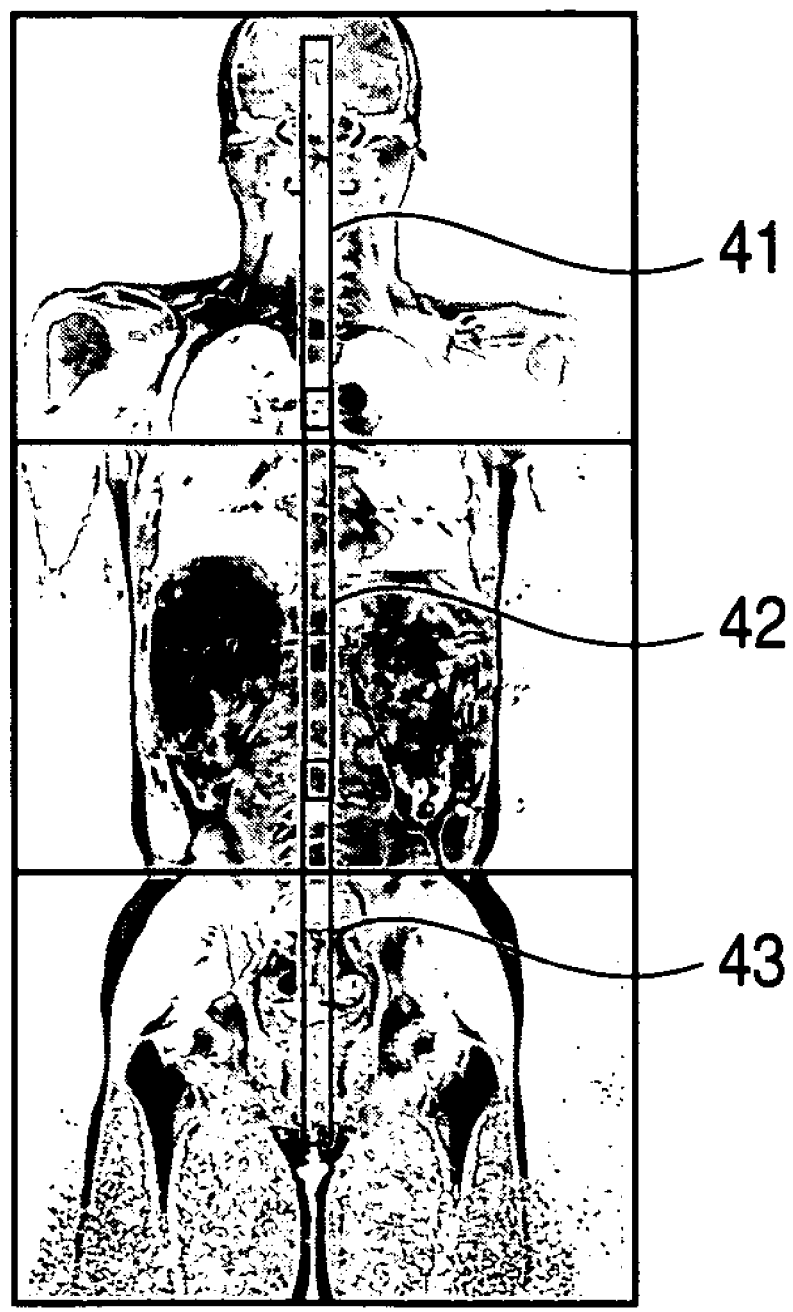
FIG. 7 is a diagram showing an example of a setting state of the ROI in accordance with the second embodiment.
Figure 8:
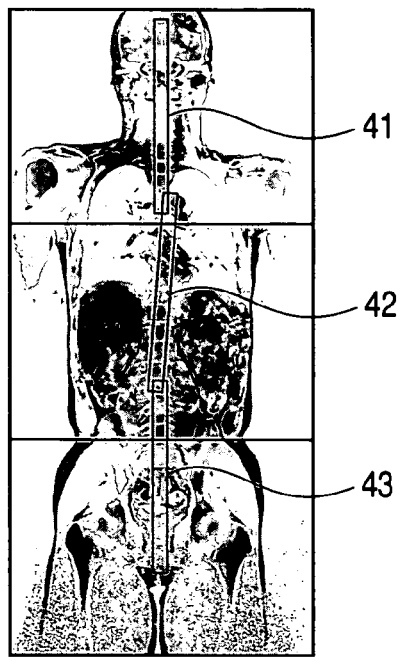
FIG. 8 is a diagram showing an example of changing the ROI in accordance with the second embodiment.
Figure 9:
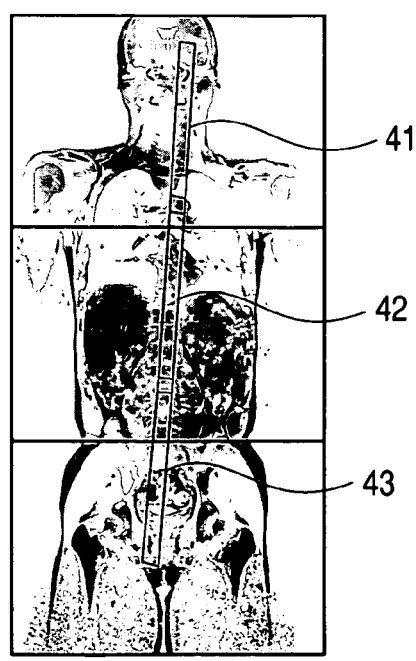
FIG. 9 is a diagram showing another example of changing the ROI in accordance with the second embodiment.

Subsequently, in step Sb11, the calculating unit 12 changes an ROI other than the changed ROI so as to be parallel to the changed ROI. For example, it is assumed that the ROI 42 is rotated as illustrated in FIG. 8 from the state where three ROIs 41, 42, and 43 are set as illustrated in FIG. 7. In this case, the calculating unit 12 rotates and moves the ROIs 41 and 43 so that the ROIs 41 and 43 are parallel to the ROI 42 and aligned in a state as illustrated in FIG. 9. In this case, when the original ROIs 41, 42, and 43 are superimposed on each other as illustrated in FIG. 7, the calculating unit 12 reproduces the superimposition as illustrated in FIG. 9. After finishing the designation of the whole ROIs, the calculating unit 12 returns to a waiting state from steps Sb6 to Sb8.

In addition, the calculating unit 12 displays the designated ROIs so that the designated ROIs are superimposed on the reference image as illustrated in FIGS. 7 to 9, for example.

After finishing the designation of the ROI, the operator instructs to start an imaging operation by manipulating the input unit 14. When the calculating unit 12 is instructed to start an imaging operation during a waiting state from steps Sb7 to Sb9, the calculating unit 12 proceeds from step Sb9 to step Sb12. In step Sb12, the calculating unit 12 sets each of the ROIs determined at that moment as the FOV.

In step Sb13, the calculating unit 12 sends instructions to the control unit 7 to perform an imaging operation on each of the FOVs set in step Sb12. In step Sb14, the calculating unit 12 reorganizes images in each of the FOVs on the basis of the collected NMR signal and connects the reorganized images to each other, thereby generating a reorganized image corresponding to the ROI.

On the other hand, when the calculating unit 12 is instructed to start an imaging operation during a waiting state from steps Sb3 to Sb5, the calculating unit 12 proceeds from step Sb5 to step Sb15. In step Sb15, the calculating unit 12 sets the ROI as it is as the FOV.

In step Sb16, the calculating unit 12 sends instructions to the control unit 7 to perform an imaging operation on the FOV set in step Sb15. In step Sb17, the calculating unit 12 reorganizes images in the FOV on the basis of the collected NMR signal.

According to the second embodiment, when the operator desires to obtain a reorganized image related to a region exceeding the available FOV, the operator needs to designate a plurality of ROIs. However, since the ROIs are automatically aligned parallel to each other, the operator does not need to manually adjust the position of the ROIs. Accordingly, it is possible to reduce burdens imposed on the operator compared to the case of requiring such a task.

In addition, according to the second embodiment, it is possible to remarkably increase throughputs of a positioning scanning. That is, since a plurality of ROIs are automatically aligned parallel to each other, it is possible to suitably maintain relative positions of the plurality of ROIs when connecting the reorganized images related to each of the FOVs to each other, thereby increasing connection precision.

Third Embodiment

In a third embodiment, the calculating unit 12 further includes several functions described later. A first function is a function of determining a plurality of ROIs designated to be parallel to each other by manipulations in the input unit 14. The first function restricts designation of the ROIs so that one of the ROIs does not exceed the available FOV. A second function is a function of moving one of the ROIs in accordance with designation of movement by manipulations in the input unit 14. Moreover, the second function changes an ROI other than the moved ROI to keep track of the movement of a reference point in a region superimposed by the moved ROI. A third function is a function of instructing the control unit 7 to perform an imaging operation on each of the plurality of FOVs, and connecting a plurality of images obtained through a plurality times of imaging operations, thereby generating image data related to the ROI.

Hereinafter, operations of the MRI apparatus according to the third embodiment having the above-mentioned construction will be described.

Figure 10:
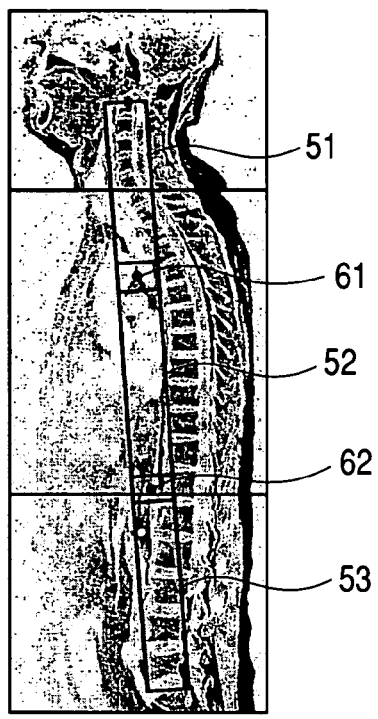
FIG. 10 is a diagram showing an example of a setting state of the ROI in accordance with a third embodiment of the invention.
Figure 11:
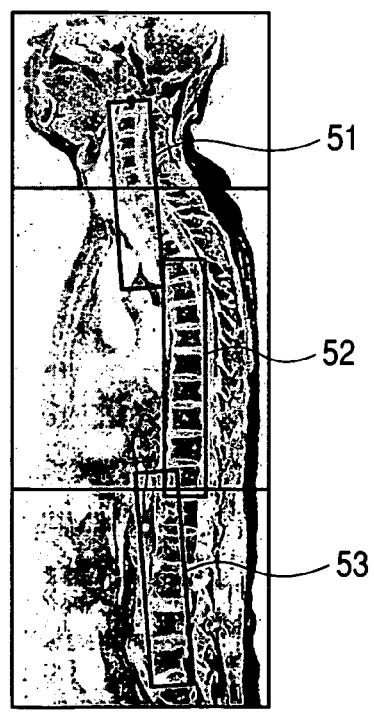
FIG. 11 is a diagram showing an example of changing the ROI in accordance with the third embodiment.
Figure 12:
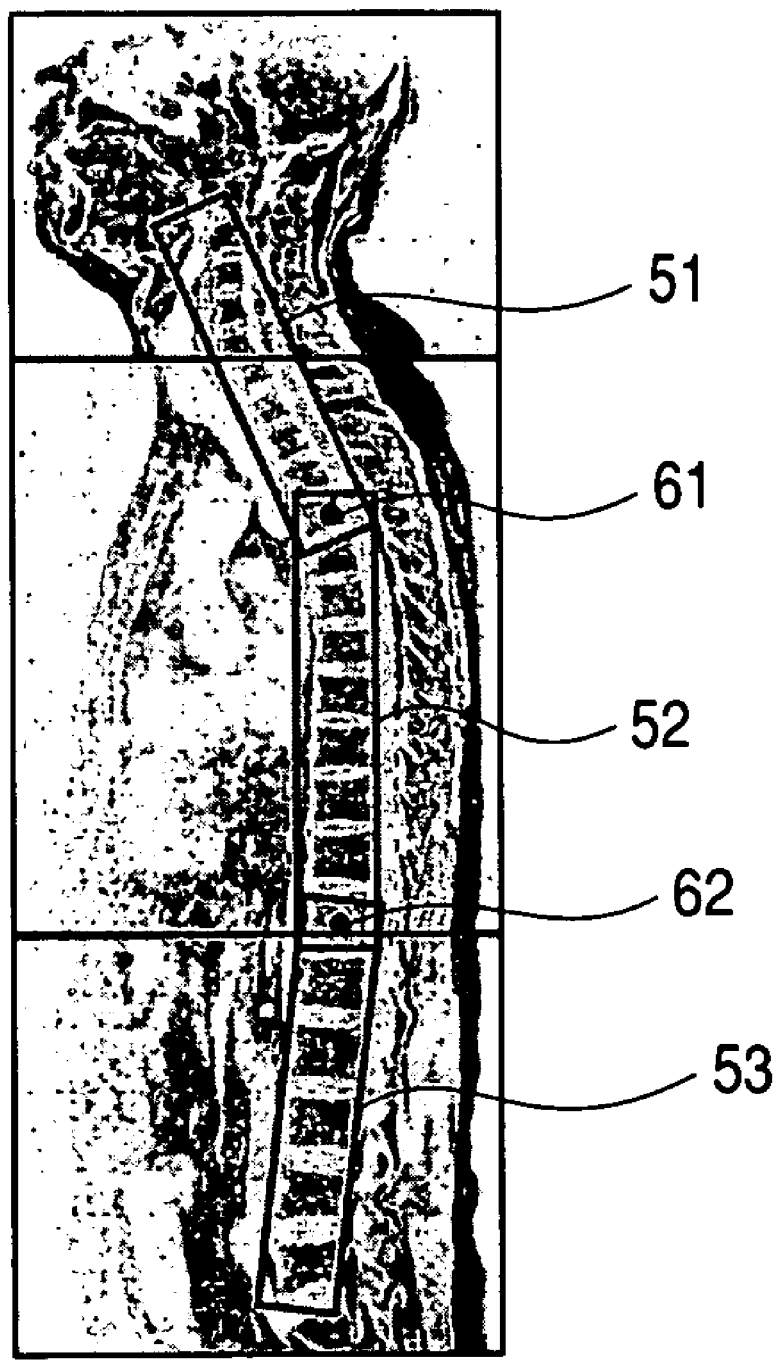
FIG. 12 is a diagram showing another example of changing the ROI in accordance with the third embodiment.

The processing sequence of the calculating unit 12 in the third embodiment is the same as that of the second embodiment as illustrated in FIG. 6, excepting that the operation in step Sb11 of the third embodiment is different from that of the second embodiment. That is, in step Sb11, the calculating unit 12 changes an ROI other than the moved ROI to keep track of the movement of a reference point in a region superimposed by the moved ROI. For example, it is assumed that the ROI 52 is moved as illustrated in FIG. 11 from the state where three ROIs 51, 52, and 53 are set as illustrated in FIG. 10. In this case, the calculating unit 12 moves the ROIs 51 and 53 so that the ROIs 51 and 53 keep track of the movement of reference points 61 and 62 and are aligned in a state as illustrated in FIG. 12. In addition, the reference points 61 and 62 may be designated by the operator, or a center position of the superimposed region of the ROIs may be automatically set as the reference point.

According to the third embodiment, when the operator desires to obtain a reorganized image related to a region exceeding the available FOV, the operator needs to designate a plurality of ROIs. However, since the ROIs are automatically aligned to keep the partly superimposed state between the ROIs, the operator does not need to manually adjust the position of the ROIs even when one of the ROIs is changed. Accordingly, it is possible to reduce burdens imposed on the operator compared to the case of requiring such a task.

Various modifications can be made to the embodiments of the invention in the following manner.

In the first embodiment, it may be possible to set the FOV so as not to include a portion of the ROIs.

Additional advantages and modifications will readily occur to those skilled in the art. Therefore, the invention in its broader aspects is not limited to the specific details and representative embodiments shown and described herein. Accordingly various modifications may be made without departing from the spirit or scope of the general inventive concept as defined by the appended claims and their equivalents.

What is claimed is:

1. A magnetic resonance imaging apparatus comprising:
   an imaging unit applying a gradient magnetic field and a radio frequency pulse to an inspection body in an magnetostatic field and generating a magnetic resonance signal;
   a bed having a top panel for placing the inspection body thereon and sliding the top panel in a longitudinal direction;
   a radio frequency coil for detecting the magnetic resonance signal;
   a display unit displaying a positioning image;
   a determining unit determining an ROI (a region of interest) on the basis of designation on the positioning image;
   a comparing unit comparing the ROI with an available FOV (a field of view) defined by the magnetostatic field;

a calculating unit calculating a plurality of FOVs including the ROI when the comparing unit determines that the size of the ROI is greater than that of the available FOV; and a control unit controlling the imaging unit, the bed, and the radio frequency coil so as to perform an imaging operation on each of the FOVs.

2. The magnetic resonance imaging apparatus according to claim 1, further comprising a generating unit connecting a plurality of images obtained by performing the imaging operation on the each of the FOVs and generating a connected image.

3. The magnetic resonance imaging apparatus according to claim 1, further comprising a determining unit determining a point of interest in the ROI, wherein the calculating unit calculates the plurality of FOVs so that the point of interest is positioned in the middle of a single FOV.

4. A magnetic resonance imaging apparatus comprising:

an imaging unit applying a gradient magnetic field and a radio frequency pulse to an inspection body in an magnetostatic field and generating a magnetic resonance signal;

a bed having a top panel for placing the inspection body thereon and sliding the top panel in a longitudinal direction;

a radio frequency coil for detecting the magnetic resonance signal;

a display unit displaying a positioning image;

a determining unit determining a plurality of ROIs (a region of interest), the size of each of which is smaller than that of an available FOV (a field of view) defined by the magnetostatic field, on the basis of designation on the positioning image;

a moving unit moving at least one of the ROIs on the basis of the designation on the positioning image and moving an ROI other than the moved ROI to be in a predetermined state with respect to the moved ROI;

a fixing unit fixing the plurality of ROIs; and a control unit controlling the imaging unit, the bed, and the radio frequency coil so as to perform an imaging operation on each of the ROIs fixed by the fixing unit.

5. The magnetic resonance imaging apparatus according to claim 4, further comprising a generating unit connecting a plurality of images obtained by performing the imaging operation on the each of the FOVs and generating a connected image.

6. The magnetic resonance imaging apparatus according to claim 4, wherein the moving unit moves the ROI other than the ROI moved on the basis of the designation on the positioning image so as to be aligned substantially parallel to the moved ROI.

7. The magnetic resonance imaging apparatus according to claim 4, wherein the moving unit moves the ROI other than the ROI moved on the basis of the designation on the positioning image so as to be aligned substantially linear to the moved ROI.

8. The magnetic resonance imaging apparatus according to claim 4, wherein the moving unit moves another ROI, a portion of which is superimposed on the ROI moved on the basis of the designation on the positioning image, so as to be superimposed on the moved ROI substantially at the same position as the position where the ROIs are superimposed to each other before moving the moved ROI.

9. An imaging method in a magnetic resonance imaging apparatus having an imaging unit applying a gradient magnetic field and a radio frequency pulse to an inspection body in an magnetostatic field and generating a magnetic resonance signal, a bed having a top panel for placing the inspection body thereon and sliding the top panel in a longitudinal direction, a radio frequency coil for detecting the magnetic resonance signal, and a display unit displaying a positioning image, the method comprising:

determining an ROI (a region of interest) on the basis of designation of the positioning image;

comparing the ROI with an available FOV (a field of view) defined by the magnetostatic field;

calculating a plurality of FOVs including the ROI when it is determined that the size of the ROI is greater than that of the available FOV; and controlling the imaging unit, the bed, and the radio frequency coil so as to perform an imaging operation on each of the FOVs.

10. The imaging method according to claim 9, further comprising connecting a plurality of images obtained by performing the imaging operation on the each of the FOVs and generating a connected image.

11. The imaging method according to claim 9, further comprising determining a point of interest in the ROI, wherein the plurality of FOVs are calculated so that the point of interest is positioned in the middle of a single FOV.

12. An imaging method in a magnetic resonance imaging apparatus having an imaging unit applying a gradient magnetic field and a radio frequency pulse to an inspection body in an magnetostatic field and generating a magnetic resonance signal, a bed having a top panel for placing the inspection body thereon and sliding the top panel in a longitudinal direction, a radio frequency coil for detecting the magnetic resonance signal, and a display unit displaying a positioning image, the method comprising:

determining a plurality of ROIs (a region of interest), the size of each of which is smaller than that of an available FOV (a field of view) defined by the magnetostatic field, on the basis of designation on the positioning image;

moving at least one of the ROIs on the basis of the designation on the positioning image and moving an ROI other than the moved ROI to be in a predetermined state with respect to the moved ROI;

fixing the plurality of ROIs; and controlling the imaging unit, the bed, and the radio frequency coil so as to perform an imaging operation on each of the fixed ROIs.

13. The imaging method according to claim 12, further comprising connecting a plurality of images obtained by performing the imaging operation on the each of the FOVs and generating a connected image.

14. The imaging method according to claim 12, wherein the ROI other than the ROI moved on the basis of the designation on the positioning image is moved so as to be aligned substantially parallel to the moved ROI.

15. The imaging method according to claim 12, wherein the ROI other than the ROI moved on the basis of the designation on the positioning image is moved so as to be aligned substantially linear to the moved ROI.

16. The imaging method according to claim 12, wherein another ROI, a portion of which is superimposed on the ROI moved on the basis of the designation on the positioning image, is moved so as to be superimposed on the moved ROI substantially at the same position as the position where the ROIs are superimposed to each other before moving the moved ROI.

* * * * *